(12) United States Patent
Wong

(10) Patent No.: US 8,766,636 B2
(45) Date of Patent: Jul. 1, 2014

(54) MRI SHORT COILS

(75) Inventor: Wai Ha Wong, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 640 days.

(21) Appl. No.: 12/969,473

(22) Filed: Dec. 15, 2010

(65) Prior Publication Data

US 2012/0153955 A1    Jun. 21, 2012

(51) Int. Cl.
  *G01V 3/00*    (2006.01)
(52) U.S. Cl.
  USPC .......................................................... 324/322
(58) Field of Classification Search
  CPC ................... G01R 33/34046; G01R 33/34076
  USPC ................................................. 324/300–322
  See application file for complete search history.

(56) References Cited

U.S. PATENT DOCUMENTS

| | | | | |
|---|---|---|---|---|
| 4,885,539 | A | * | 12/1989 | Roemer et al. ................. 324/318 |
| 5,619,996 | A | * | 4/1997 | Beresten ........................ 600/422 |
| 5,689,189 | A | * | 11/1997 | Morich et al. ................. 324/318 |
| 6,008,650 | A | * | 12/1999 | Behbin .......................... 324/318 |
| 6,043,658 | A | * | 3/2000 | Leussler ........................ 324/318 |
| 6,285,189 | B1 | | 9/2001 | Wong |
| 6,980,000 | B2 | | 12/2005 | Wong et al. |
| 7,403,006 | B2 | | 7/2008 | Garwood et al. |
| 7,425,828 | B2 | | 9/2008 | Garwood et al. |

OTHER PUBLICATIONS

Wong, et al., "Millipede" Imaging Coil Design for High Field Micro Imaging Applications, Proc. Intl. Soc. Mag. Reson. Med. 8, p. 1399, 2000.*
Doty, et al., Radio frequency coil technology for small-animal MRI, NMR Biomed., 20: 304-325, 2007.*
Wong, The millipede comes out of the birdcage, Nov. 22, 2010, available at http://www.spinsights.net/2010/11/the-millipede-comes-out-of-the-birdcage/.*
Chaumeil, et al., In vivo detection of PI3K pathway inhibition by hyperpolarized 13C MRSI at 14 Tesla, Proc. Intl. Soc. Mag. Reson. Med. 18, p. 400, 2010.*
Mispelter et al.,"NMR Probeheads for Biophysical and Biomedical Experiments," Imperial College Press, London, United Kingdom, Chapter 8, p. 301-435, 2006; the year of publication is sufficiently earlier than the effective U.S. filing date and any foreign priority date that the particular month of publication is not in issue.

* cited by examiner

*Primary Examiner* — Melissa Koval
*Assistant Examiner* — Daniel Miller

(57) ABSTRACT

According to one aspect, a magnetic resonance imaging (MRI) scanner includes a short birdcage (e.g. millipede) distributed-capacitance radio-frequency (RF) coil formed from one or more patterned planar conductive foils. The transverse extent (e.g. diameter) of the coil is at least a factor of 3, for example about a factor of 10, larger than the longitudinal (z-axis) extent of the coil. Flux-return gaps may be provided between the sample measurement volume defined by the coil and RF shields adjacent to the sample measurement volume, to confine the RF magnetic field to the sample measurement volume. Exemplary coils described herein are particularly suited for very high-frequency MRI measurements.

5 Claims, 3 Drawing Sheets

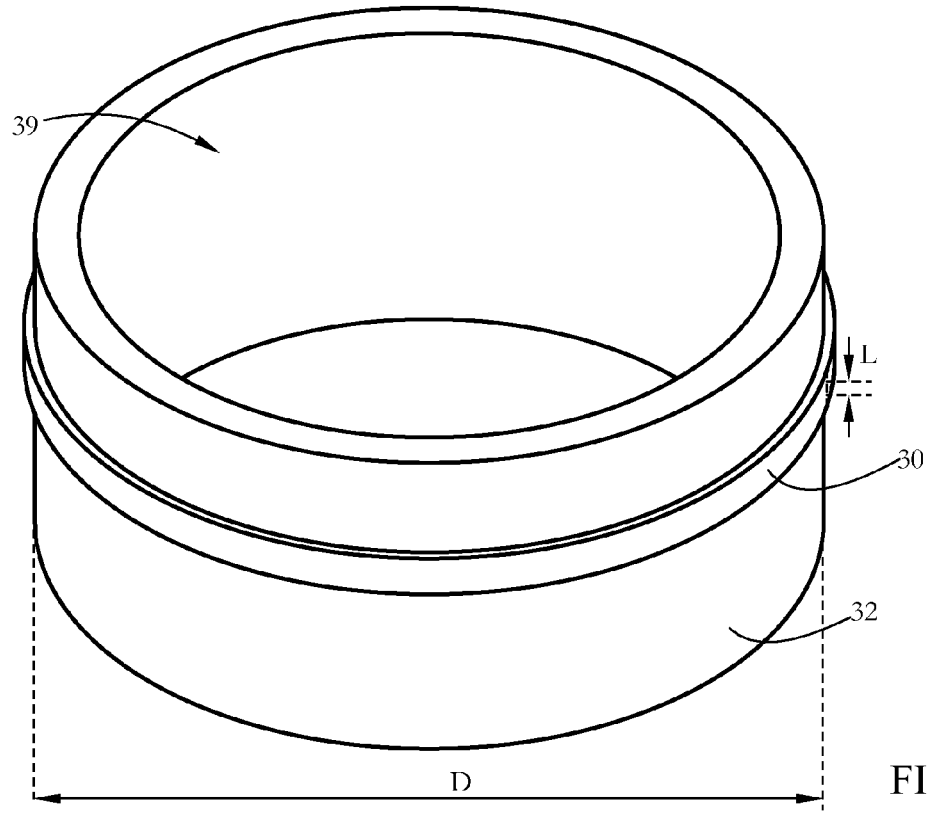
FIG. 2-A
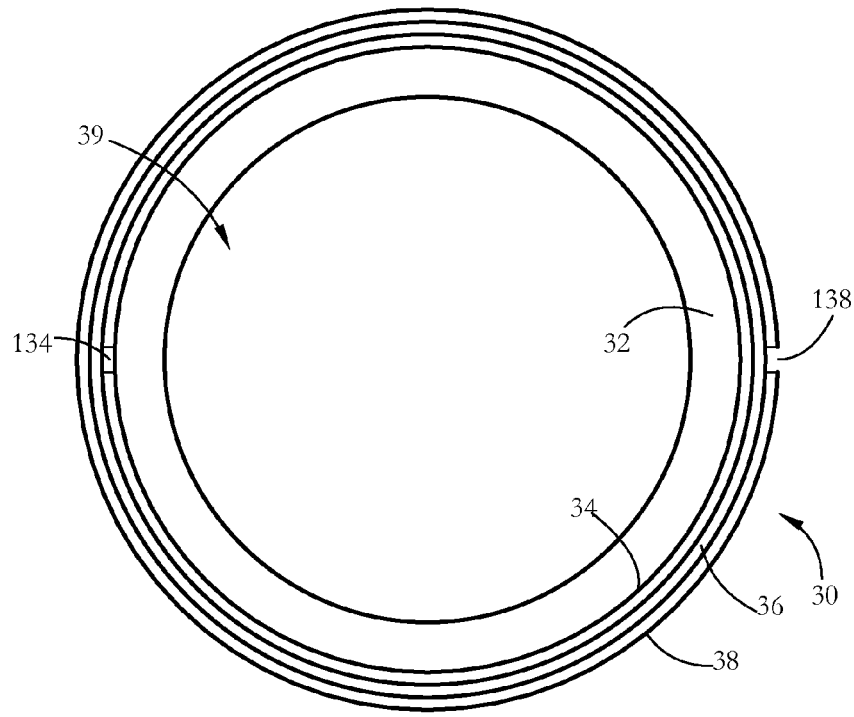
FIG. 2-B

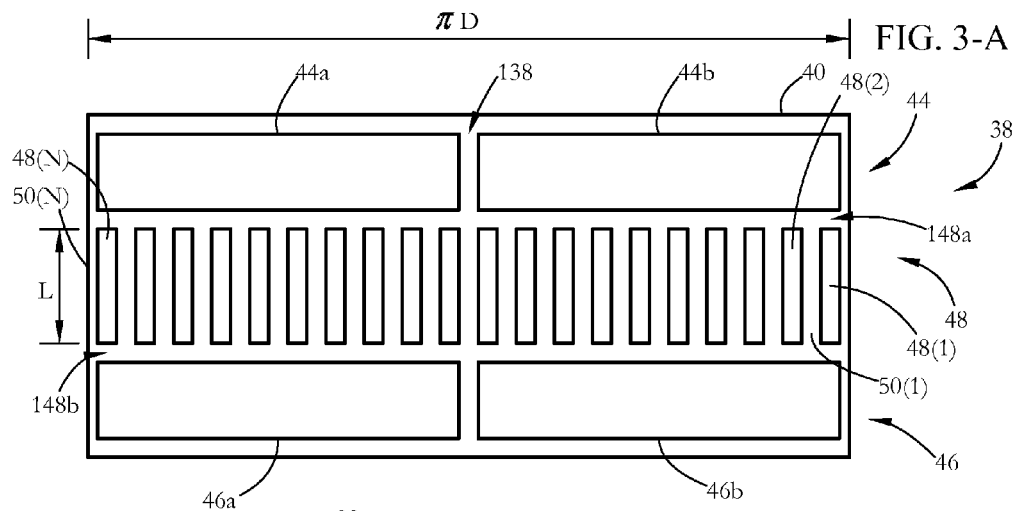
FIG. 3-A
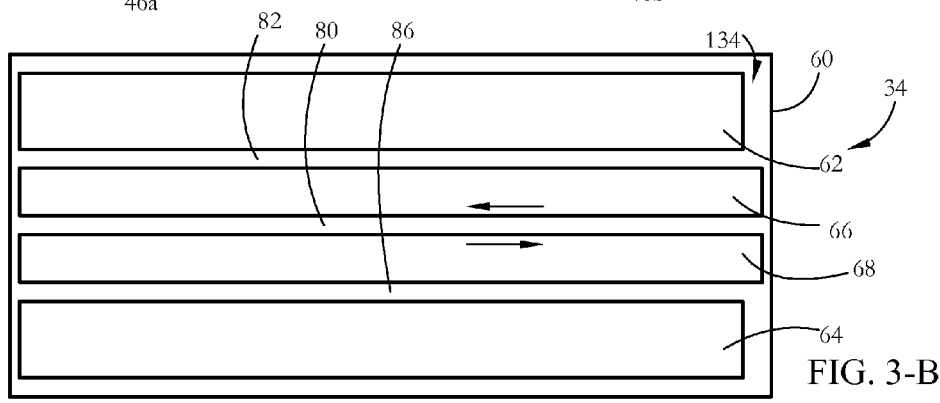
FIG. 3-B
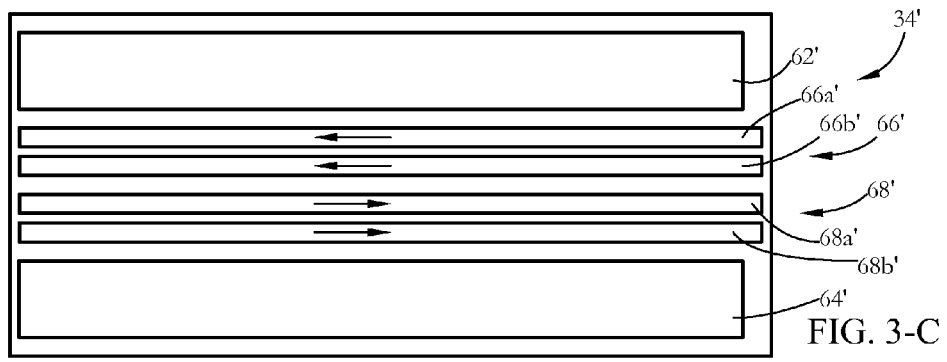
FIG. 3-C

MRI SHORT COILS

FIELD OF THE INVENTION

The invention in general relates to magnetic resonance imaging (MRI), and in particular to MRI radio-frequency (RF) coils.

BACKGROUND OF THE INVENTION

Magnetic resonance imaging (MRI) systems typically include a superconducting magnet for generating a static magnetic field $B_0$, and one or more special-purpose radio-frequency (RF) coils for generating a time-varying magnetic field $B_1$ perpendicular to the field $B_0$, and for detecting the response of a sample of interest (e.g. part of a human or animal) to the applied magnetic fields. The direction of the static magnetic field $B_0$ is commonly denoted as the z-axis or longitudinal direction, while the plane perpendicular to the z-axis is commonly termed the x-y or transverse direction.

Several types of RF coils have been used in MRI systems, including solenoid coils, saddle-shaped coils, TEM resonators, and birdcage coils. Birdcage coils typically include two transverse rings, and a relatively large number of vertical rungs connecting the rings. Birdcage coils are multiply-resonant structures in which specified phase-relationships are established for current flowing along multiple vertical rungs to generate a transverse RF field.

Generating high-resolution MRI images is facilitated by employing spatially-homogeneous RF magnetic fields. Spatial variations in the magnetic field can be created by variations in environmental properties as well as system design features. The design of robust, convenient systems yielding spatially-homogeneous RF magnetic fields can be particularly challenging for high RF-frequencies, where common MRI sample losses are relatively high.

SUMMARY OF THE INVENTION

According to one aspect, a magnetic resonance imaging (MRI) radio-frequency (RF) coil assembly comprises a coil support, and a distributed-capacitance millipede MRI radio-frequency (RF) coil mounted on the coil support. The RF coil comprises a coil conductor formed from at least one patterned foil and defining a pair of longitudinally-spaced transverse conducting rings electrically interconnected by a plurality of longitudinal conducting strips. The RF coil generates a transverse RF magnetic field. A transverse extent of a measurement volume defined within the RF coil exceeds a longitudinal extent of the measurement volume by at least a factor of 3.

According to another aspect, an apparatus comprises a birdcage magnetic resonance imaging (MRI) radio-frequency (RF) coil configured to generate a transverse RF magnetic field, wherein a transverse extent of a measurement volume defined within the RF coil exceeds a longitudinal extent of the measurement volume by at least a factor of 3.

According to another aspect, an apparatus comprises a magnet for applying a static magnetic field to a sample of interest; and a birdcage MRI radio-frequency (RF) coil coupled to the magnet and configured to apply a transverse RF magnetic field to the sample of interest, wherein a transverse extent of a measurement volume defined within the RF coil exceeds a longitudinal extent of the measurement volume by at least a factor of 3.

According to another aspect, a method comprises employing a birdcage MRI radio-frequency (RF) coil to apply a transverse RF magnetic field to a sample, and detecting a response of the sample to the applied RF magnetic field. A transverse extent of a sample measurement volume defined within the RF coil exceeds a longitudinal extent of the measurement volume by at least a factor of 3.

BRIEF DESCRIPTION OF THE DRAWINGS

The foregoing aspects and advantages of the present invention will become better understood upon reading the following detailed description and upon reference to the drawings where:

FIG. 2-A shows an isometric view of a magnetic resonance imaging (MRI) RF coil assembly according to some embodiments of the present invention.

FIG. 2-B shows a top view of the RF coil assembly of FIG. 2-A, according to some embodiments of the present invention.

FIG. 3-A shows a patterned foil used to make an outer layer of a coil such as the one shown in FIG. 2-A upon rolling about a longitudinal axis, according to some embodiments of the present invention.

FIG. 3-B shows a patterned foil used to make an inner layer of a coil such as the one shown in FIG. 2-A upon rolling about a longitudinal axis, according to some embodiments of the present invention.

FIG. 3-C shows another patterned foil that can be used to make an inner layer of a coil such as the one shown in FIG. 2-A upon rolling about a longitudinal axis, according to some embodiments of the present invention.

DETAILED DESCRIPTION OF THE INVENTION

Figure 1:
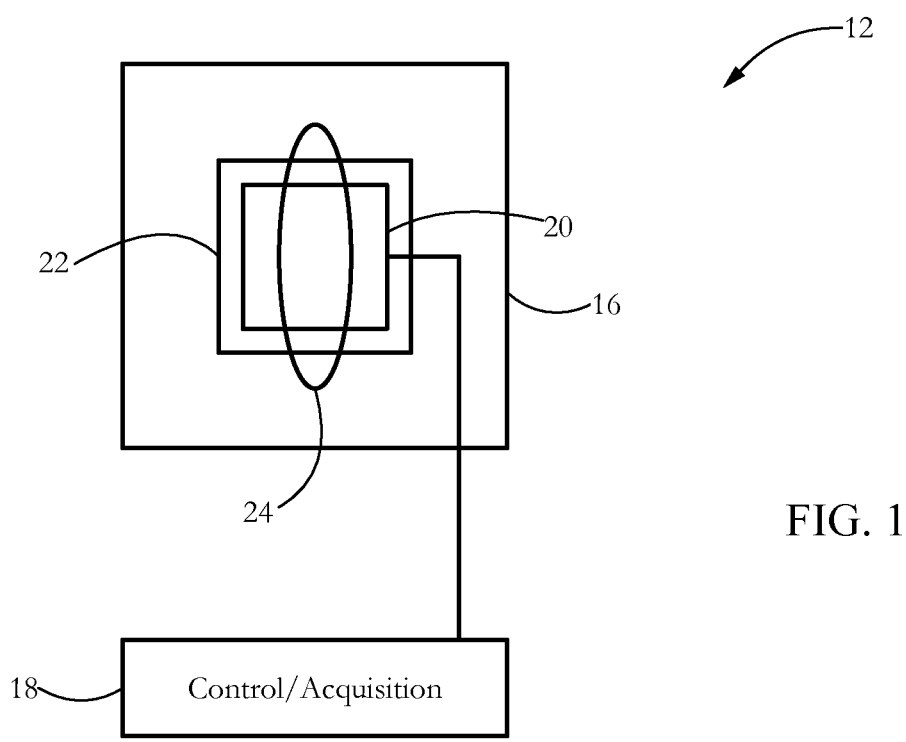
FIG. 1 is a schematic diagram of an exemplary MRI system according to some embodiments of the present invention.

In the following description, a set of elements includes one or more elements. Any reference to an element is understood to encompass one or more elements. Each recited element or structure can be formed by or be part of a monolithic structure, or be formed from multiple distinct structures. A longitudinally-monolithic foil is a foil that is not formed by connecting multiple longitudinally-separated parts; a longitudinally-monolithic foil may include multiple layers stacked along a non-longitudinal direction. The statement that a coil is used to perform a measurement is understood to mean that the coil is used as transmitter, receiver, or both. Unless otherwise stated, any recited electrical or mechanical connections can be direct connections or indirect connections through intermediary circuit elements or structures. A conductive ring is a structure that provides a ring-shaped current path to RF current; such a structure can include two or three concentric, capacitively-coupled physical rings, some or all of which may include longitudinal slots; such physical rings can be formed, for example, by part of a central foil, a capacitive shield, and a capacitance band. A conductive ring can also include a single, monolithic physical ring providing a ring-shaped path to DC current. The statement that a longitudinal conductor electrically couples two conductive rings is understood to mean that the longitudinal conductor provides a current path for RF current flowing between the two rings. Such a longitudinal conductor can be physically (resistively) connected to one or both of the rings (providing both DC and RF current paths), or capacitively coupled to one or both of the rings.

The following description illustrates embodiments of the invention by way of example and not necessarily by way of limitation.

FIG. 1 is a schematic diagram illustrating an exemplary magnetic resonance imaging (MRI) scanner 12 according to some embodiments of the present invention. MRI scanner 12 comprises a magnet 16, a set of radio-frequency (RF) coils 20, a set of gradient and/or shim coils 22, and a control/acquisition system (console) 18 electrically connected to magnet 16 and coils 20, 22. A sample of interest 24 is positioned within magnet 16 and coils 20, 22 while MRI measurements are performed on the sample. The sample of interest may include part of a human or non-human animal.

To perform a measurement, a sample is inserted into a measurement space defined within coils 20. Magnet 16 applies a longitudinal static magnetic field $B_0$ to the sample. Shim coils are used to correct spatial inhomogeneities in the static magnetic field $B_0$, while gradient coils are used to generate x, y, and/or z-direction gradients in the applied static magnetic field. Control/acquisition system 18 comprises electronic components configured to apply desired radio-frequency pulses to RF coils 20, and to acquire data indicative of the magnetic resonance properties of the sample. Coils 20 are used to apply transverse radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

FIGS. 2-A-B show isometric and top views, respectively, of a radio-frequency (RF) MRI birdcage coil 20. In some embodiments, RF coil 20 is a millipede coil, which is a birdcage coil having a relatively large (e.g. hundreds) of longitudinal conductive legs spaced apart such that the mutual inductance of the coil is greater than the self inductance of the legs of the coil. For further information on millipede coils see for example Wong et al., U.S. Pat. No. 6,285,189 B1.

RF coil 20 includes a birdcage RF short coil conductor 30 mounted on an insulating coil support 32. In the illustration of FIGS. 2-A-B, coil conductor 30 is disposed around (outside) coil support 32. In some embodiments, coil conductor 30 may be disposed inside or mounted otherwise on a coil support. Coil support 32 has a cylindrical shape, and generally matches coil conductor 30 in shape and size. Coil support 32 is made from an insulating support material that does not substantially interfere with nuclear magnetic resonance measurements, such as polytetrafluoroethylene (PTFE, Teflon®).

In some embodiments, coil conductor 30 is formed by three concentric cylindrical shells 34, 36, 38: an inner patterned conductive cylindrical shell 34, and outer patterned conductive cylindrical shell 38, and a dielectric cylindrical shell 36 disposed between cylindrical shells 34, 38. Shells 34, 36 and 38 may be formed by a patterned, double-sided flexible circuit board such as a Rogers® Corporation RT5880 high-frequency laminate comprising a glass microfiber reinforced PTFE composite. Depending on the desired dielectric constant for dielectric cylindrical shell 36, other circuit boards may be used in some embodiments, such as Rogers®Corporation RT6002 or RT6010, for example. Standard circuit etching processes may be used to generate desired circuit patterning as shown in FIGS. 3-A-C, the flexible circuit sheet is rolled to form a cylinder, and the opposite ends are soldered to secure the cylindrical shape. The resulting cylindrical coil is then inserted into coil support 32. A strip-shaped eddy-current reduction gap (slot) 134 formed in an RF shield part of inner shell 34 is situated opposite (180 degrees away from) a strip-shaped eddy-current reduction gap (slot) 138 formed in an RF shield part of outer shell 38.

Coil conductor 30 defines an internal measurement volume 39 having a transverse extent (size) D in the transverse (x-y) plane, and a longitudinal extent (size) L in the longitudinal (z) direction. The longitudinal extent L may be better seen in the illustration of FIG. 3-A. As shown in FIG. 2-A, in the case of a cylindrical coil, the transverse extent is defined by the internal coil diameter. The transverse extent of the measurement volume is the longest extent of the measurement volume in the transverse plane. In some embodiments, the transverse extent D exceeds the longitudinal extent L by a factor D/L larger than 3, in particular larger than 5, and lower than about 30. For example, the transverse-to-longitudinal size ratio may be between 5 and 15, for example about 10, in some embodiments. In an exemplary embodiment suitable for small-animal MRI measurements, a short coil as described above may define a measurement volume having a diameter of about 30 mm and a longitudinal extent of 2-3 mm. In an exemplary embodiment suitable for human MRI measurements, a short coil as described above may define a measurement volume having a diameter of about 30 cm and a longitudinal extent of 1-3 cm.

FIGS. 3-A and 3-B show top views of outer cylindrical shell 38 and inner cylindrical shell 34, respectively, in rolled out form. The sheets shown in FIGS. 3-A and 3-B are used to make outer cylindrical shell 38 and inner cylindrical shell 34 upon rolling about the z-axis axis, according to some embodiments of the present invention. Shells 34 and 38 include patterned metallic conductors formed on dielectric substrates 40, 60, respectively. In some embodiments, a short MRI coil as described herein may have an inner shell as shown in FIG. 3-A and an outer shell as shown in FIG. 3-B.

As shown in FIG. 3-A, outer cylindrical shell 38 includes a central longitudinal-conductor band 48 flanked on opposite longitudinal sides by top and bottom RF shield bands (shields) 44, 46, respectively. Longitudinal-conductor band 48 comprises a plurality of longitudinal, mutually-parallel longitudinal conductors 48(1), 48(2), ..., 48(N), separated by longitudinal inter-conductor gaps 50(1), ..., 50(N). The z-axis extent L of longitudinal conductor band 48 defines the longitudinal extent of the sample measurement volume of the RF coil. RF shields 44, 46 are situated along a shielded longitudinal region of coil conductor 30. RF shields 44, 46 form longitudinally-slotted cylindrical conductors disposed on opposite longitudinal sides of the sample measurement volume. RF shields 44, 46 confine the spatial extent of the RF magnetic field. RF shields 44, 46 also shield the static magnetic field within the sample measurement volume 64 from the effects of current flow outside the coil structure. Eddy-current reduction gap 138 divides shields 44, 46 into separate continuous strips 44a-b and 46a-b, respectively, and limits the flow of eddy currents through RF shields 44, 46. At the same time, each RF shield 44, 46 is capacitively coupled through dielectric to the RF shields 62, 64 in a different layer (shown in FIG. 3-B), so that each RF shield 44, 46 acts as a conductive ring at high frequencies.

A pair of ring-shaped flux return gaps 148a-b provide a longitudinal separation between the longitudinal ends of conductor strip 48 and shields 44, 46, respectively. Each flux return gap 148a-b is formed by a generally-transverse circular strip having a width (longitudinal extent) sufficiently large to permit the passage of magnetic flux lines between conductor strip 48 and shields 44, 46, so that substantially no magnetic flux generated by the coil extends to the area enclosed by shields 44, 46, and consequently the RF coil window and the sample measurement volume are defined by the distance between flux return gaps 148a-b.

As shown in FIG. 3-B, inner cylindrical shell 34 includes a pair of longitudinally-separated, ring-shaped central capacitor bands 66, 68 flanked on opposite longitudinal sides by top and bottom RF shield bands (shields) 62, 64, respectively. Capacitor bands 66, 68 form mutually-parallel continuous transverse rings, and overlap the top and bottom sides, respectively, of longitudinal conductor band 48. The top edge of capacitor band 66 coincides with the top edge of conductor strip 48, while the bottom edge of capacitor band 68 coincides with the bottom edge of conductor strip 48. Capacitor bands 66, 68 are mutually separated longitudinally by a ring-shaped inter-band gap 80, and are separated longitudinally from RF shields 62, 64 by ring-shaped flux return gaps 82, 86, respectively. Current flows through capacitor bands 66, 68 in opposite transverse directions, as illustrated by the horizontal arrows in FIG. 3-B. As in other birdcage coils, the current flow around the circuit is distributed sinusoidally.

FIG. 3-C shows a top view of a cylindrical shell 34' in rolled out form, according to some embodiments of the present invention. In the configuration of FIG. 3-C, top and bottom capacitor bands 66', 68' are each formed by two longitudinally-separated continuous ring-shaped sections 66a-b', 68a0b', respectively, and are flanked by RF shield bands (shields) 62, 64 as described above. The direction of current flow through capacitor bands 66', 68' is illustrated by horizontal arrows in FIG. 3-C. The additional capacitor band spacings in the configuration of FIG. 3-C provide additional flux return paths, thus allowing improved RF field homogeneity. At the same time, the additional capacitor band spacings reduce the distributed coil capacitance, and thus affect the coil resonant frequency.

In some embodiments in which the coil diameter D is about 30 mm, the coil height (longitudinal extent) L is about 10 mm and the gap 80 is about 3 mm, outer shell 38 (shown in FIGS. 2-B and 3-A) may include hundreds of longitudinal strips 48(1)-(N), each having a width (transverse extent) and interconductor gap 50(1)-(N) on the order of 0.01" (e.g. 0.2-0.3 mm). The widths of flux return gaps 148a-b and eddy-current reduction gaps 134-138 (FIGS. 3-A-B) may also be on the order of 0.01" (e.g. 0.2-0.3 mm).

The coil designs described above may be used with standard MRI hardware, pulse sequences, data acquisition software and post-image reconstruction techniques. In some embodiments, the RF pulses applied to coil conductor 30 may be as described by Garwood et al. in U.S. Pat. Nos. 7,425,828 B2 and 7,403,006 B2. The frequencies of the applied pulses may be on the order of tens to hundreds of MHz. The coil may be used to generate a transverse RF magnetic field of any desired transverse orientation, and/or with quadrature detection.

The systems and methods described above allow the practical use of volume coils at very high frequencies. Conventional MRI volume coils are commonly cylinder-shaped, and have heights much longer than their diameters. Using a tall height creates a region of uniform RF magnetic field in the middle of the coil cylinder. Lumped-element components such as capacitors and inductors are used to yield desired resonant frequencies. At very high frequencies, where the wavelength is no longer much larger (e.g. at least 10× larger) than the coil dimensions, such conventional lumped-element coil circuits may fail. If the wavelength is comparable in size to the coil dimensions, the coil may include substantial undesired signal phase variations along its extent. In some embodiments, for an exemplary long coil 30 mm in diameter, such wavelength-related circuit effects may be observed for frequencies on the order of 400 MHz and higher, frequencies which correspond roughly to wavelengths of less than about 50 cm for a velocity of about ⅔c (wherein c denotes the speed of light). Reducing the coil height as described above may allow a reduction in such observed wavelength effects at very high frequencies.

Surface coils, which are formed by planar loops that generate magnetic fields perpendicular to the loop plane, may allow performing measurements at higher frequencies. At the same time, longitudinal magnetic fields generated by such surface coils may be less convenient for sample loading than transverse fields generated by volume coils. Also, surface coils commonly have significantly poorer RF field homogeneity than volume coils. For a more detailed description of a surface coil design see for example Wong et al. U.S. Pat. No. 6,980,000 B2.

The exemplary short volume coil designs described above allow operation at very high frequencies while using conventional transmit and receive circuits and other hardware/software. For an exemplary coil having a diameter of 30 mm, such very high frequencies may include frequencies above about 400 MHz, while for an exemplary coil having a diameter of 25 cm, such very high frequencies may include frequencies above about 50 MHz. Standard pulse sequences, data acquisition and post-image reconstruction techniques and hardware may be used. Such short coil designs allow generating two orthogonal transverse fields of desired orientation, allowing circular polarization and quadrature detection. The RF magnetic field may be generally uniform radially (in a transverse plane), and also be confined longitudinally through the use of flux return gaps between the coil measurement volume and the RF shields, in order to minimize sample loading. In addition, reducing the amount of sample enclosed within the sample measurement volume allows a reduction in the tuning range required to bring the coil to a desired resonant frequency after insertion of the sample into the coil changes the resonant frequency of the measurement circuit.

In some embodiments, short coils as described above may be used to generate axial images. Short coils as described above may allow achieving improved sample filling factors and consequently better signal-to-noise ratios (SNR) than corresponding conventional long volume coils with slice selection. Such short coils may also pick up less undesired sample noise outside the RF sample window, which also allows improved SNR.

In embodiments in which the entire capacitance and inductance needed for the coil are provided by patterned foil conductors, the coil manufacturing process does not require employing and connecting lumped-element components, which allows simplifying the coil manufacturing/assembly. Also, as space available for the coil shrinks, less space is available for components such as lumped-element capacitors and inductors. Providing substantially the entire coil capacitance and inductance in a distributed manner allows reducing the space the coil assembly size.

The particular height (longitudinal extent) chosen for a coil may be chosen according to a number of parameters. Generally, a given MRI application may constrain the coil diameter. For example, small-animal MRI may use coil diameters on the order of tens of mm, while human MRI may use coil diameters on the order of tens of cm. For an exemplary coil having a diameter of 30 mm, a coil height of 3 mm may be well suited for performing measurements at a desired frequency in excess of 400 MHz.

The above embodiments may be altered in many ways without departing from the scope of the invention. Accordingly, the scope of the invention should be determined by the following claims and their legal equivalents.

What is claimed is:

1. A magnetic resonance imaging (MRI) radio-frequency (RF) coil assembly comprising:
   a coil support; and
   a distributed-capacitance millipede MRI RF coil mounted on the coil support, the MRI RF coil comprising a coil conductor, the coil conductor compromising: a first patterned foil defining the plurality of longitudinal conducting strips; and a second patterned foil defining the pair of transverse conducting rings the first patterned foil defining a first pair of RF shields situated on opposite longitudinal sides of the longitudinal conducting strips, the first pair of RF shields being separated from the longitudinal conducting strips by a corresponding pair of ring-shaped flux return gaps for longitudinally confining an RF magnetic field generated by the RF coil to the measurement volume; and the second patterned foil defining a second pair of RF shields situated on opposite longitudinal sides of the pair of transverse conducting rings, the second pair of RF shields being separated from the pair of transverse conducting rings by the corresponding pair of ring shaped flux return gaps, the MRI RF coil being configured to generate a transverse RF magnetic field, wherein a transverse extent of a measurement volume being defined within the RF coil exceeds a longitudinal extent of the measurement volume by at least a factor of 3.

2. The coil assembly of claim 1, wherein the transverse extent of the measurement volume exceeds the longitudinal extent of the measurement volume by less than a factor of 30.

3. The coil assembly of claim 2, wherein the transverse extent of the measurement volume exceeds the longitudinal extent of the measurement volume by a factor between 5 and 15.

4. The coil assembly of claim 1, further comprising a pair of coil RF shields situated on opposite longitudinal sides of the measurement volume, the pair of RF shields being separated from the measurement volume by a corresponding pair of ring-shaped flux return gaps for longitudinally confining an RF magnetic field generated by the RF coil to the measurement volume.

5. The coil assembly of claim 1, wherein the longitudinally-spaced conductive rings are formed by a pair of capacitor bands facing and capacitively coupled to the plurality of longitudinal conducting strips.

* * * * *